United States Patent
Parulkar et al.

(10) Patent No.: US 7,082,560 B2
(45) Date of Patent: Jul. 25, 2006

(54) SCAN CAPABLE DUAL EDGE-TRIGGERED STATE ELEMENT FOR APPLICATION OF COMBINATIONAL AND SEQUENTIAL SCAN TEST PATTERNS

(75) Inventors: Ishwardutt Parulkar, San Francisco, CA (US); Ha M. Pham, Milpitas, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 348 days.

(21) Appl. No.: 10/444,458

(22) Filed: May 23, 2003

(65) Prior Publication Data

US 2003/0218488 A1 Nov. 27, 2003

Related U.S. Application Data

(60) Provisional application No. 60/383,318, filed on May 24, 2002, provisional application No. 60/383,319, filed on May 24, 2002.

(51) Int. Cl.
*G01R 31/28* (2006.01)
(52) U.S. Cl. .................. 714/726; 327/215; 327/218
(58) Field of Classification Search ............... None
See application file for complete search history.

(56) References Cited

U.S. PATENT DOCUMENTS

| | | | | |
|---|---|---|---|---|
| 5,646,567 A | * | 7/1997 | Felix | 327/202 |
| 5,656,962 A | * | 8/1997 | Banik | 327/202 |
| 6,300,809 B1 | * | 10/2001 | Gregor et al. | 327/200 |
| 6,348,825 B1 | * | 2/2002 | Galbi et al. | 327/218 |
| 6,943,605 B1 | * | 9/2005 | Thadikaran et al. | 327/218 |
| 2003/0204802 A1 | * | 10/2003 | Sim | 714/726 |
| 2004/0041610 A1 | * | 3/2004 | Kundu | 327/215 |

* cited by examiner

*Primary Examiner*—Guy Lamarre
*Assistant Examiner*—John P. Trimmings
(74) *Attorney, Agent, or Firm*—Osha Liang LLP

(57) ABSTRACT

An apparatus and method of scanning a dual edge-triggered flip-flop with scan capability includes a first scan slave element capable of capturing data on a positive edge of a clock signal; and a second scan slave element capable of capturing data on a negative edge of the clock signal. An apparatus and method of scanning a dual edge-triggered flip-flop with scan capability includes a scan slave element capable of capturing data on either a positive edge or a negative edge of a clock signal; wherein a control signal determines whether the scan slave element captures data on the positive edge or negative edge of the clock signal.

15 Claims, 6 Drawing Sheets

US 7,082,560 B2

SCAN CAPABLE DUAL EDGE-TRIGGERED STATE ELEMENT FOR APPLICATION OF COMBINATIONAL AND SEQUENTIAL SCAN TEST PATTERNS

CROSS-REFERENCE TO RELATED APPLICATIONS

This application claims the benefit under 35 U.S.C. § 119(e) of U.S. Provisional Application No. 60/383,318, filed on May 24, 2002, and U.S. Provisional Application No. 60/383,319, filed on May 24, 2002.

BACKGROUND OF INVENTION

A computer system typically uses variety of digital integrated circuits (ICs). For example, desktop computer systems commonly include digital ICs to implement user interfaces for receiving user instructions and handling the electronic processing of those instructions. As the complexity of the implementation increases, the system of digital ICs becomes more sophisticated. In turn, as digital devices become more sophisticated, the task of designing, testing, and debugging the digital systems implementing the devices becomes more difficult. Thus, validation of a system design and verification of the proper functionality of the system has become an important factor in the development of computer technology.

Mechanisms to observe the sequential logic state of a digital IC on a tester, or in a system, are critical to debugging operations. The observation is typically achieved when the IC is exercising its intended functionality on the tester or the system. To observe the logical state of any digital IC, the state elements need to have scan capability. Scan capability refers to the inclusion of an alternative path used to control and/or observe the state of a state element. With various types of scan capability and global scan architecture, there are three fundamental ways of observing logic state of a digital IC: shadow scan, dumping state, and single stepping.

In the shadow scan, key state elements to be observed are "shadowed" in scannable state elements and the scanned information is shifted out serially in real time without stopping the functional clock of the IC. In the dumping state, at a predetermined clock cycle during the operation of the IC, the functional clock signal is stopped. Then, the state is latched in the slave portions of the state elements and is serially shifted out for observation. In the single stepping, at every clock step, the functional clock signal is stopped, the state is latched in the slave portions of the state elements, and is shifted out for observation. Also, the state information is shifted back in to restore the state of the machine to what it was when the clock stopped. Once the shifting out and shifting in are completed, the functional clock is re-started.

There are various test design strategies, know as design-for-testability (DFT) techniques for ensuring the ratio of the number of passed ICs to the total number of tested ICs is high. In DFT, test patterns may be generated using an automatic test pattern generation (ATPG) algorithm to be applied via chip pins or scan mechanism. Scan capability refers to the inclusion of an alternative path used to control and/or observe the state of a state element.

Scan-based ATPG is a method of testing digital circuits for manufacturing defects. In this method, a state element, e.g., flip-flop or latch, in the circuit is modified to give controllability and observability of the state of the element using a sequential path that can switch between test operation (test mode) and evaluative operation (normal mode).

Two scan-based algorithms are combinational and sequential ATPG. Combinational ATPG is when all state elements in the design have scan capability. In combinational ATPG, all state elements can be controlled to a known state in test mode. The combinatorial logic between state elements can be evaluated in one clock cycle and the result latched in the state elements. Sequential ATPG is when only some of the state elements in the design have scan capability. In sequential ATPG, only those elements that have scan capability can be controlled to a known state in scan mode. The combinatorial logic between state elements and non-state elements are evaluated over multiple clock cycles and the results are stored in the scan capable elements.

Typically, flip-flops in digital circuits are single edge-triggered. These flip-flops latch state either on the positive (0 to 1 transition) of the clock or on the negative edge (1 to 0 transition). A faster data rate and some power savings can be achieved if the state element is designed such that it latches the state on the positive as well as the negative edge of the clock. This type of flip-flop that latches on both the positive edge and negative edge of the clock is known as a dual edge-triggered flip-flop.

Referring to FIG. 1, a dual edge-triggered flip-flop (10) is shown. As can be seen, the dual edge-triggered flip-flop has an input (D), an output (Q), and receives a clock signal (CLK). At the positive edge of the clock signal (CLK), the input (D) is sent to the output (Q). Also, at the negative edge of the clock signal (CLK), the input (D) is sent to the output (Q). Those skilled in the art will appreciate that while a D flip-flop is used as the exemplary flip-flop throughout this specification. The present invention is equally applicable to any dual edge-triggered flip-flop.

Referring to FIG. 2, a circuit diagram of the dual edge-triggered flip-flop (10) is shown. Essentially, the flip-flop (10) includes two latches (12) and (14). These latches (12) and (14) are each a pair of cross-coupled inverters. Transmission gates (16) and (18) are coupled around latch (12) and receive the complement of the clock signal ($\overline{CLK}$) and the clock signal (CLK) respectively. Likewise, transmission gates (20) and (22) are coupled around latch (14) and receive the clock signal (CLK) and complement of the clock signal ($\overline{CLK}$) respectively. The transmission gates may be pairs of a P-type Metal Oxide Semiconductor (P-MOS) and an N-type Metal Oxide Semiconductor (N-MOS). Thus, on the positive edge of the clock signal, the data (D) latched in latch (12) is sent to output (Q) and on the negative edge of the clock signal, the data (D) latched in latch (14) is sent to output (Q).

SUMMARY OF INVENTION

In accordance with an aspect of one or more embodiments of the present invention, a dual edge-triggered flip-flop with scan capability comprises: a first scan element capable of transferring test patterns and capturing data on a positive edge of a clock signal; and a second scan element capable transferring test patterns and capturing data on a negative edge of the clock signal.

In accordance with an aspect of one or more embodiments of the present invention, a dual edge-triggered flip-flop with scan capability comprises a scan slave element capable of capturing data and transferring test pattern on either a positive edge or a negative edge of a clock signal, where a control signal determines whether the scan slave element captures data and transfers test pattern on the positive edge or negative edge of the clock signal.

In accordance with an aspect of one or more embodiments of the present invention, a method of scanning a dual edge-triggered flip-flop comprises: capturing data and transferring test pattern on a positive edge of a clock signal; and capturing data and transferring test pattern on a negative edge of the clock signal.

In accordance with an aspect of one or more embodiments of the present invention, a method of scanning a dual edge-triggered flip-flop comprises: capturing data and transferring test pattern on either a positive edge or a negative edge of a clock signal based on a control signal.

In accordance with an aspect of one or more embodiments of the present invention, an apparatus for scanning a dual edge-triggered flip-flop comprises: means for capturing data and transferring test pattern on a positive edge of a clock signal; and means for capturing data and transferring test pattern on a negative edge of the clock signal.

In accordance with an aspect of one or more embodiments of the present invention, an apparatus for scanning a dual edge-triggered flip-flop comprises means for capturing data and transferring test pattern on either a positive edge or a negative edge of a clock signal based on a control signal.

In accordance with an aspect of one or more embodiments of the present invention, an apparatus for scanning a dual edge-triggered flip-flop comprises: a first scan element comprising a first scan input connected to a first transmission gate, a first scan output connected to a first latch, and a second transmission gate connected to the first latch; a second scan element comprising a second scan input connected to a third transmission gate, a fourth transmission gate connected to the third transmission gate, a scan output connected to a second latch, and a fifth transmission gate connected to the second latch; a dual edged-triggered flip flop comprising a data input connected to a sixth transmission gate, a seventh transmission gate and eighth transmission gate connected to the sixth transmission gate, a data output connected to a ninth transmission gate and tenth transmission gate, a third latch connected to the seventh transmission gate and eighth transmission gate and connected to the first transmission gate and the second transmission gate of the first scan element; and a fourth latch connected to the ninth transmission gate and tenth transmission gate and connected to the fourth transmission gate and the fifth transmission gate of the second scan element.

Other aspects and advantages of the invention will be apparent from the following description and the appended claims.

DETAILED DESCRIPTION

In one or more embodiments, the present invention involves a dual edge-triggered flip-flop with scan capability for (1) observation of digital IC during debug and (2) scan based combinational and sequential ATPG. In a sequential circuit designed using flip-flops that latch state on both the edges of the clock, a scan design is required for (1) transferring test patterns on both edges of the clock using scan-based ATPG for testing the IC and (2) observing states latched on either clock edge both at the flip-flop level and global scan architecture level.

Figure 3:
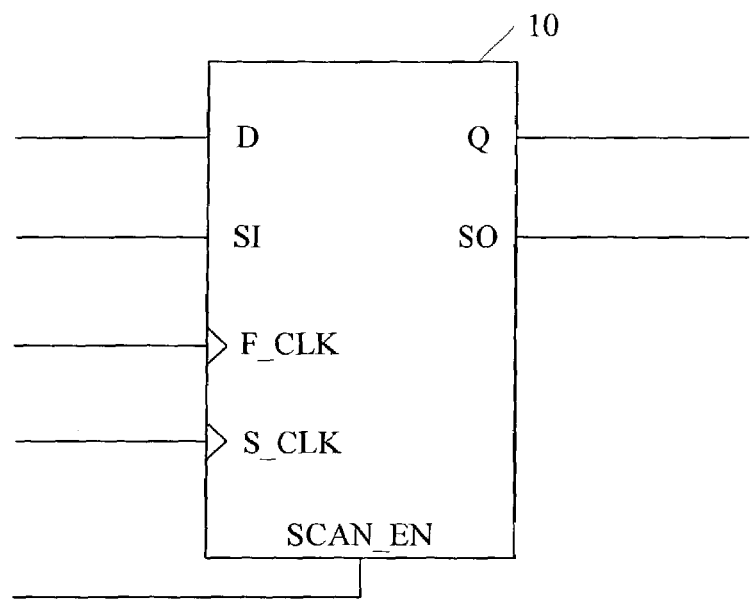
FIG. 3 is a block diagram of a dual edge-triggered flip-flop with scan capability in accordance with an embodiment of the present invention.

With dual edge-triggered flip-flops, a scan slave design and scan operation mechanism is required that transfers test patterns on both the positive and negative edges and observes the state latched at the positive edge and the state latched on the negative edge. In one or more embodiments, a scan slave is included for capturing data from either the positive or the negative half of the dual edge-triggered flip-flop. A control signal configures the clocking of the scan slave such that it captures data from one of the halves of the flip-flop. In one or more embodiments of the invention, the dual edge-triggered scan flip-flop with single edge scan capability as shown in FIG. 3 may be used for a combinational ATPG test. In this embodiment, test patterns may be generated for positive edge and negative edge applications separately. For example, test pattern 1 of 10110 may be prepared for the positive edge application and test pattern 2 of 11101 may be prepared for the negative edge application. Then, these patterns may be loaded into scan input (SI) terminal as shown in FIG. 3. When these patterns need to be loaded in a sequential path, test mode is selected by setting voltage of scan enable control (SCAN_EN) signal to high and voltage of function clock (F_CLK) signal to steady. The pattern 1 may be loaded into the sequential path using the positive edge of scan-clock (S_CLK) signal. Then, the pattern 2 is loaded in the sequential path using the negative edge of the scan clock (S_CLK) signal.

Referring to FIG. 3, a block diagram of a dual edge-triggered flip-flop with scan capability is shown. As can be seen, the dual edge-triggered flip-flop includes an input (D), an output (Q), a scan input (SI), a scan output (SO), and receives a function clock signal (F_CLK), a scan clock signal (S_CLK), and a scan enable control signal (SCAN_EN). At the positive edge of the function clock signal (F_CLK), the input (D) is sent to the output (Q). Also, at the negative edge of the function clock signal (F_CLK), the input (D) is sent to the output (Q). Further, when the scan enable control signal (SCAN_EN) is asserted, the scan input (SI) is sent to the scan output (SO). The passing of the scan input (SI) to the scan output (SO) is controlled by the scan clock signal (S_CLK).

Thus, in functional mode operation, the function clock signal (F_CLK) toggles and scan enable control signal (SCAN_EN) is low. In testing or debug mode, the scan enable control signal (SCAN_EN) is high, the function clock is steady at whatever level it was when the scan enable control signal (SCAN_EN) transitioned to high, and the scan clock (S_CLK) toggles.

Figure 2:
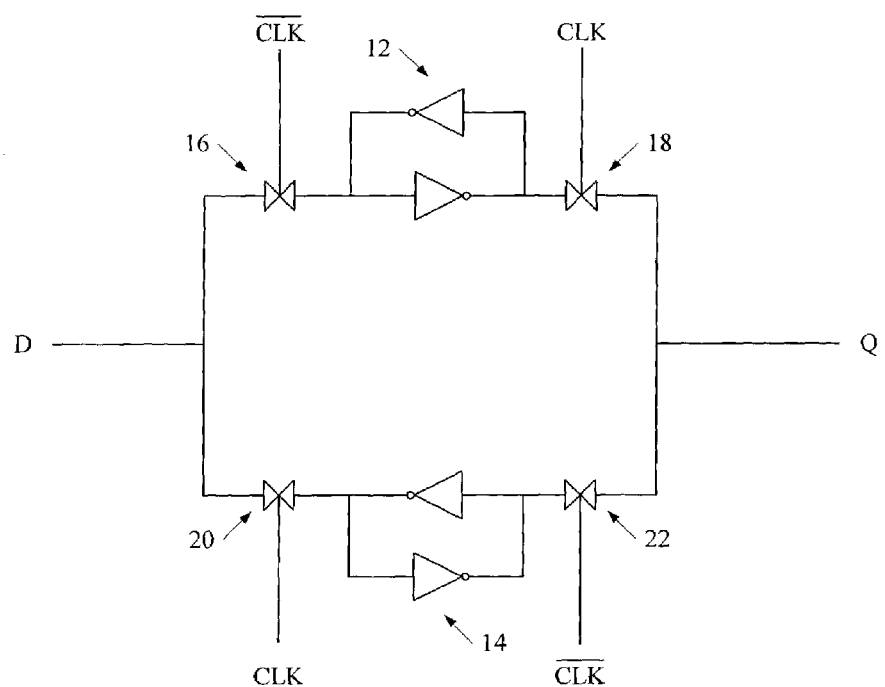
FIG. 2 is a circuit diagram of a dual edge-triggered flip-flop.
Figure 4:
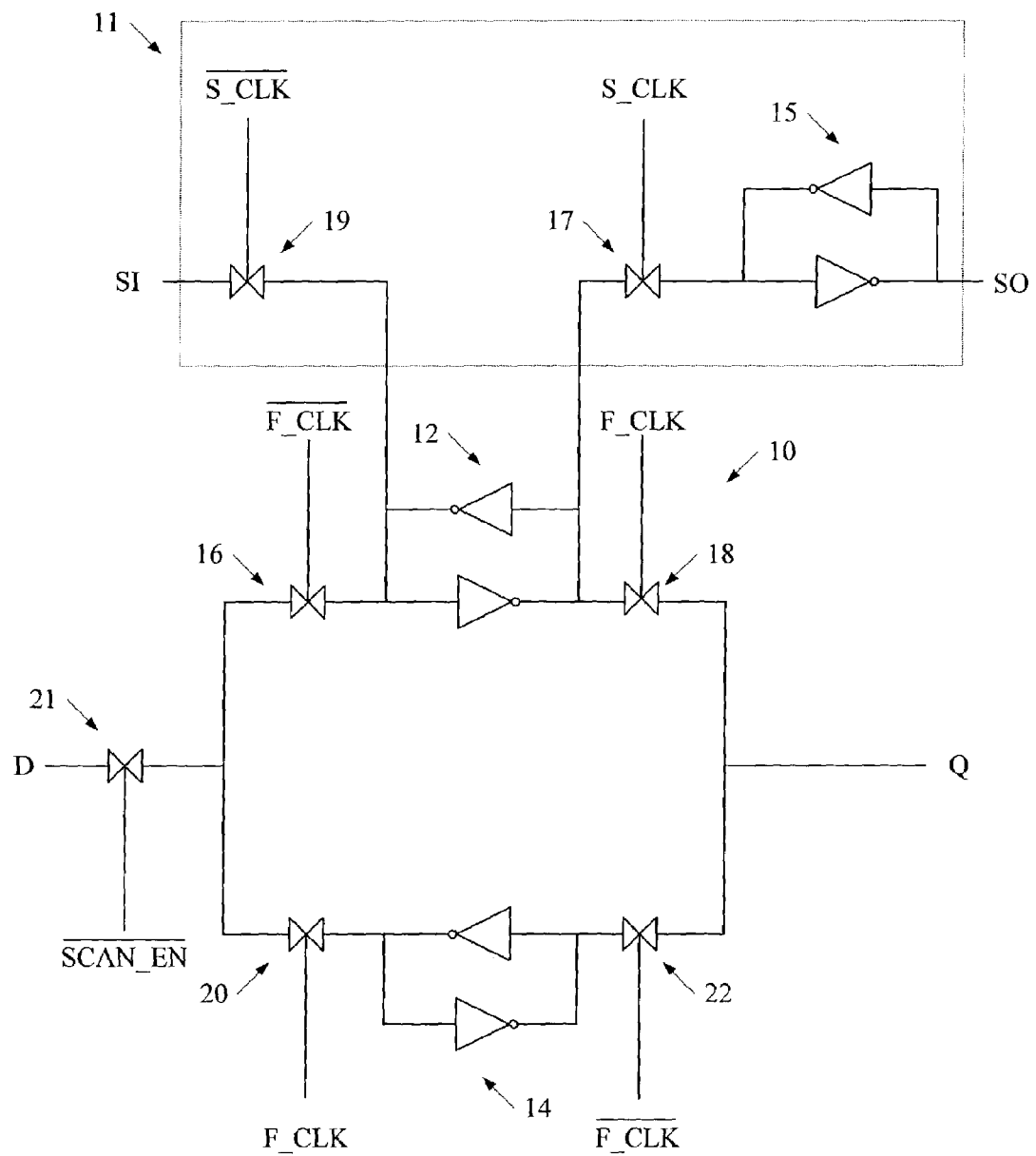
FIG. 4 is a circuit diagram of a dual edge-triggered flip-flop with scan capability in accordance with an embodiment of the present invention.

Referring to FIG. 4, a circuit diagram of the dual edge-triggered flip-flop with scan capability is shown. The circuit of the flip-flop remains the same as that shown in FIG. 2 and is driven by the function clock signal. Additionally, the dual edge-triggered flip-flop with scan capability includes a scan element (11). The scan element (11) includes a latch (15) at the scan output (SO) with transmission gates (17) and (19). The transmission gate (17) receives the scan clock (S_CLK)

and is connected to one half of the flip-flop circuitry, e.g., latch (12) as shown. The transmission gate (19) receives the complement of the scan clock ($\overline{S\_CLK}$) and connects the scan input (SI) to the same half of the flip-flop circuitry, i.e., latch (12). Also, a transmission gate (21) is included at the data input (D) and controlled by the complement of the scan enable control signal ($\overline{SCAN\_EN}$).

In one or more embodiments, this is achieved by including a scan slave in each half of the dual edge-triggered flip-flop. Each scan slave works off a different clock edge. Thus, when the clock is stopped at any point, the data latches in the flop on the last positive and negative edges and can be captured in the two scan slaves. The scan slaves may be connected in separate scan chains or a single scan chain. In the case of a single scan chain, the data shifted out is processed to isolate the positive and negative edge states of the IC.

Figure 5:
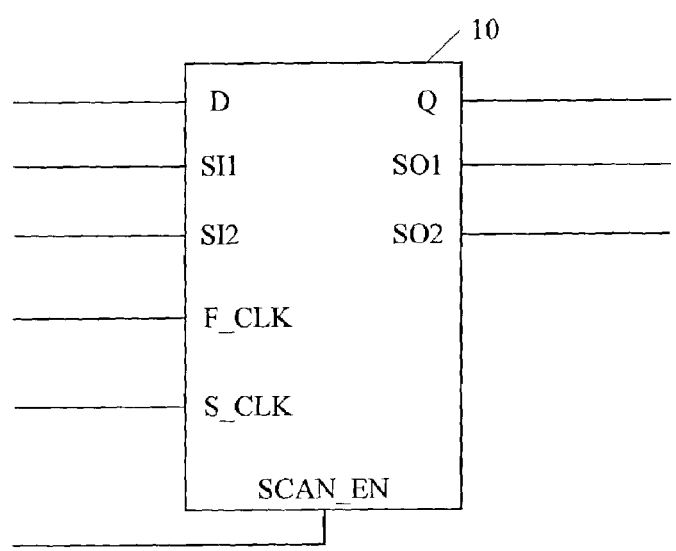
FIG. 5 is a block diagram of a dual edge-triggered flip-flop with scan capability in accordance with an embodiment of the present invention.

In an embodiment of the invention, the dual edge-triggered scan flip-flop with dual edge scan capability as shown in FIG. 5 may be used for a combinational ATPG test. In this embodiment, test patterns may be generated for positive edge and negative edge applications separately. For example, test pattern 1 of 10110 may be prepared for the positive edge application and test pattern 2 of 11101 may be prepared for the negative edge application. The patterns may be loaded into a first scan input (SI1) and a second scan input (SI2) terminals, respectively, as shown in FIG. 5. When these patterns need to be loaded in a sequential path, test mode is selected by setting voltage of scan enable control (SCAN_EN) signal to high and voltage of function clock (F_CLK) signal to steady. The pattern 1 may be loaded into the sequential path using the positive edge of scan-clock (S_CLK) signal. Then, the pattern 2 is loaded in the sequential path using the negative edge of the S_CLK signal.

Referring to FIG. 5, a block diagram of a dual edge-triggered flip-flop with scan capability is shown. As can be seen, the dual edge-triggered flip-flop includes an input (D), an output (Q), a first scan input (SI1), a second scan input (SI2), a scan output (SO1), a scan output (SO2), and receives a function clock signal (F_CLK), a scan clock signal (S_CLK), and a scan enable control signal (SCAN_EN). At the positive edge of the function clock signal (F_CLK), the input (D) is sent to the output (Q). Also, at the negative edge of the function clock signal (F_CLK), the input (D) is sent to the output (Q). Further, when the scan enable control signal (SCAN_EN) is asserted, the first and second scan inputs (SI1) and (SI2) are sent to the first and second scan outputs (SO1) and (SO2) respectively. The passing of the first and second scan inputs (SI1) and (SI2) to the first and second scan outputs (SO1) and (SO2) is controlled by the scan clock signal (S_CLK).

Thus, as before, in functional mode operation, the function clock signal (F_CLK) toggles and scan enable control signal (SCAN_EN) is low. In testing or debug mode, the scan enable control signal (SCAN_EN) is high, the function clock is steady at whatever level it was when the scan enable control signal (SCAN_EN) transitioned to high, and the scan clock (S_CLK) toggles. In the embodiment shown, both the data from the positive edge and the negative edge of the function clock signal is captured.

Figure 6:
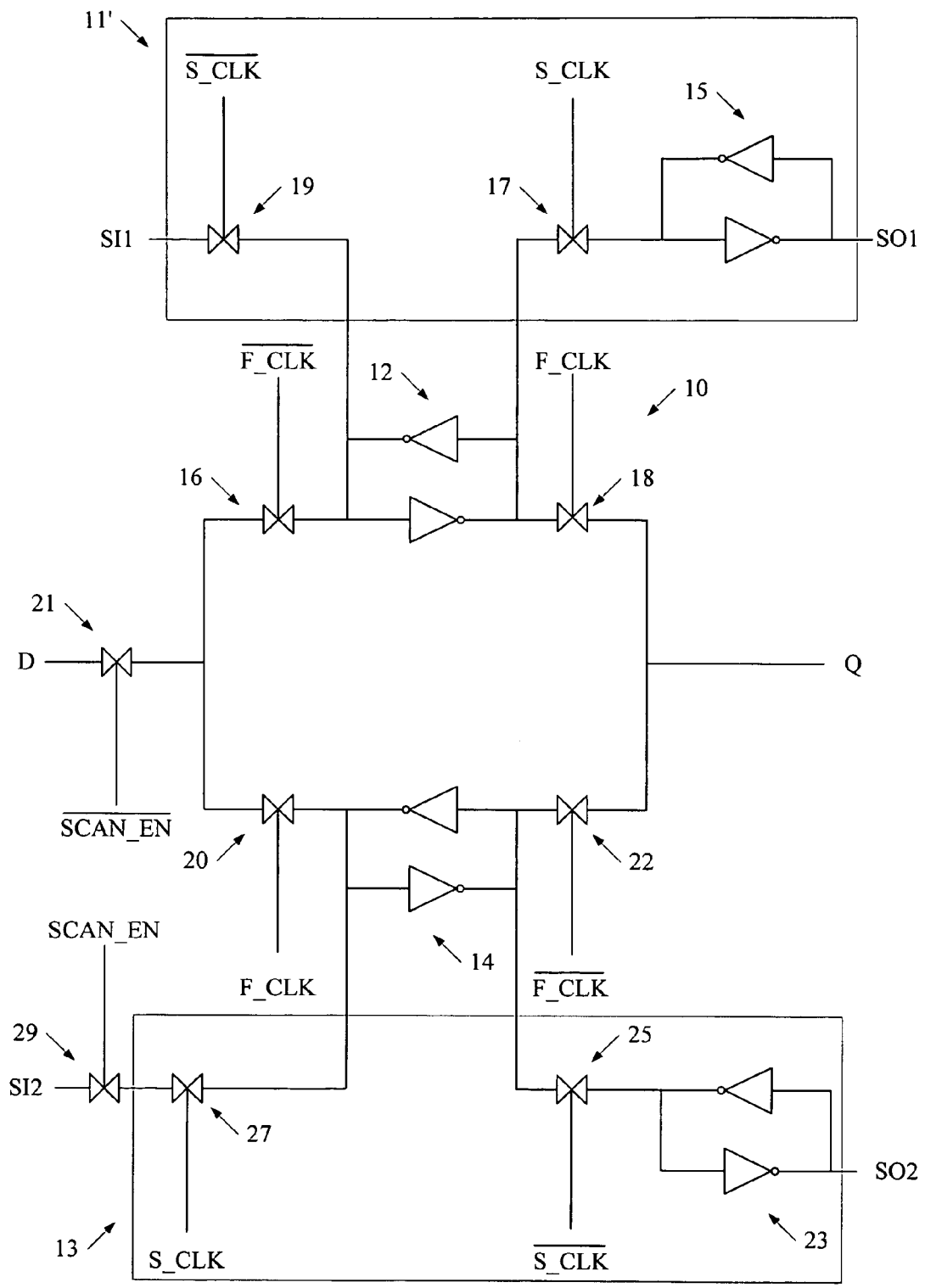
FIG. 6 is a circuit diagram of a dual edge-triggered flip-flop with scan capability in accordance with an embodiment of the present invention.

Referring to FIG. 6, a circuit diagram of the dual edge-triggered flip-flop with scan capability is shown. The circuit of the flip-flop remains the same as that shown in FIG. 4, wherein the scan element (11) of FIG. 4 corresponds to the first scan element (11') of this figure and receives a first scan input (SI1) and outputs a first scan output (SO1). Additionally, the dual edge-triggered flip-flop with scan capability includes a second scan element (13). The second scan element (13) includes a latch (23) at the second scan output (SO2) with a transmission gates (25) and (27). The transmission gate (25) receives the complement of the scan clock ($\overline{S\_CLK}$) and is connected to the other half of the flip-flop circuitry, e.g., latch (14) as shown. The transmission gate (27) receives the scan clock (S_CLK) and connects the scan input (SI2) to the same half of the flip-flop circuitry, i.e., latch (14). Also, a transmission gate (29) is included at the second scan input (SI2) and controlled by the scan enable control signal (SCAN_EN).

Figure 1:
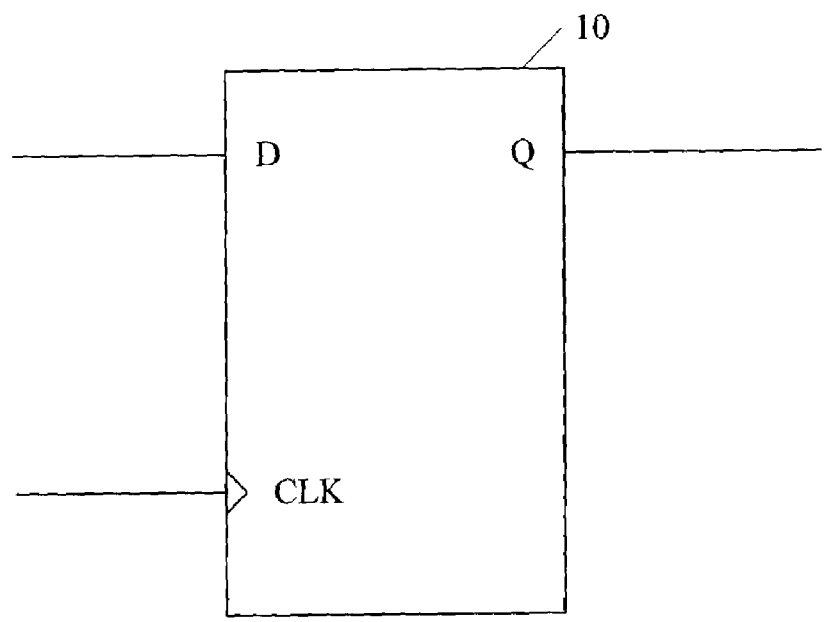
FIG. 1 is a block diagram of a dual edge-triggered flip-flop.

In an embodiment of the invention, the dual edge-triggered flip-flop may be used for a sequential ATPG test. In this embodiment, a part of the state elements is designed as the dual edge-triggered flip-flop with dual edge scan capability as shown in FIG. 5. The state elements are selectively linked to generate a sequential path for a test. Furthermore, to improve the performance of the IC test, the remaining states elements may be also designed as dual edge-triggered flip-flops without scan capability as shown in FIG. 1.

To design a test in sequential ATPG when the scan state elements are linked to generate a sequential path, another path between the scan state elements may be generated for observing the state of logical blocks, which may be in parallel to the sequential path including only the state scan elements.

For each side of the dual edge-triggered flip-flop with dual edge scan capability, test patterns are separately generated and loaded in. For example, pattern 3 and pattern 4 may be separately generated for each side of the dual edge-triggered flip-flops with dual edge scan capability as shown in FIG. 5. The pattern 3 may be transferred using positive edge of scan clock (S_CLK) signal and the pattern 4 may be transferred using negative edge of the scan clock (S_CLK) signal while selectively disabling sides of the scan flip-flops and the non-scan flip-flop. In this case, all flip-flops may behave as single edge-triggered flip-flops.

During the test mode, test pattern 3 may be loaded into the first scan input (SI1) terminal by using positive edge of scan clock (S_CLK) signal. Then, this resulting path is disabled and instead the other side of the path is enabled. Along the new resulting path, enabled path, the pattern 4 may be loaded into the second scan input (SI2) terminal using the negative edge of the scan clock (S_CLK) signal. When the pattern 3 is loaded in, the new resulting path is disabled and the old resulting path is enabled. Generally, the responses are transferred along the sequential path using positive and negative edges of the scan clock (S_CLK) signal while side portions of dual edge-triggered scan flip-flops and non-scan flip-flops are selectively disabled or enabled. As a result, two test patterns may be transferred along the sequential path by repeating these operations until a mode is switched to normal mode.

Thus, two different test operations may be able to be completed in one sequence of clock signal for each stage. As a result, testing time in sequential ATPG may also be reduced. In the examples presented above, particular sets of resulting paths in a sequential path are used to explain how to create a path for processing test patterns and the responses with sequential ATPG. However, other combinations of disabling or enabling portions of dual edge-triggered scan flip-flops and non-scan flip-flops may be used to transfer test patterns and the responses. In one aspect, IC testing is improved by providing dual edge-triggered capability to state elements and then operating the state elements selectively.

Advantages of the present invention may include one or more of the following. In one or more embodiments, transferring test patterns at an increased rate and power savings may be achieved. Those skilled in the art appreciate that the present invention may also include other advantages and features.

In one or more embodiments, a single dual-mode scan slave with a control signal is used, which reduces area overhead. Two iterations are run to collect the states after both the positive edge and the negative edge of the clock. In accordance with one or more embodiments, two scan slaves are included, which can collect data from both the positive edge and the negative edge of the clock using any scan method. In accordance with one or more embodiments, the total debugging time can be reduced by allowing state elements to be tested using either or both of the positive edge and negative edge of clock.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A dual edge-triggered flip-flop with scan capability comprising:
    a first scan element capable of transferring test patterns and capturing data on a positive edge of a clock signal, wherein the first scan element comprises a first scan input and a first scan output; and
    a second scan element capable of transferring test patterns and capturing data on a negative edge of the clock signal, wherein the second scan element comprises a second scan input and a second scan output.

2. The dual edge-triggered flip-flop with scan capability of claim 1 wherein the first scan element and second scan element are in separate scan chains.

3. The dual edge-triggered flip-flop with scan capability of claim 1 wherein the first scan element and second scan element are connected in a single scan chain.

4. The dual edge-triggered flip-flop with scan capability of claim 3 further comprising:
    a processing element for isolating at least one of the positive edge captured data and transferred test pattern and at least one of the negative edge captured data and transferred test pattern from one another.

5. A method of scanning a dual edge-triggered flip-flop comprising:
    capturing data and transferring a test pattern on a positive edge of a clock signal, wherein the test pattern is transferred using a first scan input and a first scan output; and
    capturing data and transferring a test pattern on a negative edge of the clock signal, wherein the test pattern is transferred using a second scan input and a second scan output.

6. The method of claim 5 wherein the capturing of data and transferring the test pattern on the positive edge of the clock signal and the capturing of data and transferring the test pattern on the negative edge of the clock signal occur in separate scan chains.

7. The method of claim 5 wherein the capturing of data and transferring the test pattern on the positive edge of the clock signal and the capturing of data and transferring the test pattern on the negative edge of the clock signal occur in a single scan chain.

8. The method of claim 7 further comprising:
    processing the data and the test patterns in the single scan chain to isolate at least one of the positive edge captured data and positive edge transferred test pattern and at least one of the negative edge captured data and negative edge transferred test pattern from one another.

9. An apparatus for scanning a dual edge-triggered flip-flop comprising:
    means for capturing data and transferring a test pattern on a positive edge of a clock signal, wherein the test pattern is transferred using a first scan input and a first scan output; and
    means for capturing data and transferring a test pattern on a negative edge of the clock signal, wherein the test pattern is transferred using a second scan input and a second scan output.

10. The apparatus of claim 9 wherein the means for capturing data and transferring the test pattern on the positive edge of the clock signal and the means for capturing data and transferring the test pattern on the negative edge of the clock signal are in separate scan chains.

11. The apparatus of claim 9 wherein the means for capturing data and transferring test pattern on the positive edge of the clock signal and the means for capturing data and transferring test pattern on the negative edge of the clock signal are in a single scan chain.

12. The apparatus of claim 11 further comprising:
    means for processing the data in the single scan chain to isolate at least one of the positive edge captured data and transferred test pattern and at least one of the negative edge captured data and transferred test pattern from one another.

13. An apparatus for scanning a dual edge-triggered flip-flop comprising:
    a first scan element comprising:
        a first scan input connected to a first transmission gate;
        a first scan output connected to a first latch; and
        a second transmission gate connected to the first latch;
    a second scan element comprising:
        a second scan input connected to a third transmission gate;
        a fourth transmission gate connected to the third transmission gate;
        a second scan output connected to a second latch; and
        a fifth transmission gate connected to the second latch;
    a dual edged-triggered flip flop comprising:
        a data input connected to a sixth transmission gate;
        a seventh transmission gate and eighth transmission gate connected to the sixth transmission gate;
        a data output connected to a ninth transmission gate and tenth transmission gate;
        a third latch connected to the seventh transmission gate and tenth transmission gate and connected to the first transmission gate and the second transmission gate of the first scan element; and
        a fourth latch connected to the eighth transmission gate and ninth transmission gate and connected to the fourth transmission gate and the fifth transmission gate of the second scan element.

14. The apparatus for scanning a dual edge-triggered flip-flop of claim 13,
    wherein the second transmission gate is controlled by a signal clock;
    wherein the first transmission gate is controlled by a complement of the signal clock;
    wherein the fifth transmission gate is controlled by the signal clock;

wherein the fourth transmission gate is controlled by the complement of the signal clock;
wherein the third transmission gate is controlled by a scan enable control;
wherein the sixth transmission gate is controlled by the scan enable control;
wherein the eighth transmission gate is controlled by a function clock;
wherein the seventh transmission gate is controlled by a complement of the function clock;
wherein the tenth transmission gate is controlled by the function clock;
wherein the ninth transmission gate is controlled by the complement of the function clock.

15. The apparatus for scanning a dual edge-triggered flip-flop of claim 13, the first latch comprising a first pair of cross-coupled inverters;

the second latch comprising a second pair of cross-coupled inverters;

the third latch comprising a third pair of cross-coupled inverters;

the fourth latch comprising a fourth pair of cross-coupled inverters.

* * * * *